United States Patent [19]
Kondou et al.

[11] Patent Number: 5,361,188
[45] Date of Patent: Nov. 1, 1994

[54] COOLING APPARATUS OF ELECTRONIC EQUIPMENT

[75] Inventors: Yoshihiro Kondou, Ibaraki; Hitoshi Matsushima, Ryugasaki; Toshio Hatada, Tsuchiura; Hiroshi Inouye; Toshihiro Komatsu, both of Ibaraki; Takao Ohba; Akira Yamagiwa, both of Hadano, all of Japan

[73] Assignee: Hitachi Ltd., Tokyo, Japan

[21] Appl. No.: 115,669

[22] Filed: Sep. 2, 1993

Related U.S. Application Data

[63] Continuation of Ser. No. 782,094, Oct. 24, 1991, abandoned.

[30] Foreign Application Priority Data

Oct. 24, 1990 [JP] Japan .................................. 2-284263

[51] Int. Cl.$^5$ .............................................. H05K 7/20
[52] U.S. Cl. .............................. 361/695; 165/104.34; 165/908; 257/712; 361/796
[58] Field of Search .................. 62/418; 257/712, 713; 165/80.3, 122, 126, 104.34, 908; 361/689, 690, 694, 695, 796, 717–722

[56] References Cited

U.S. PATENT DOCUMENTS

| | | | |
|---|---|---|---|
| 3,626,251 | 12/1971 | Vigue | 165/122 |
| 4,149,218 | 4/1979 | Carrubba | 361/384 |
| 4,291,364 | 9/1981 | Andros | 361/384 |
| 4,449,164 | 5/1984 | Carlson | 361/384 |
| 4,498,118 | 2/1985 | Bell | 361/384 |
| 4,674,004 | 6/1987 | Smith | 361/384 |
| 4,851,965 | 7/1989 | Gabuzda | 361/383 |
| 4,931,904 | 6/1990 | Yiu | 361/384 |
| 5,079,438 | 1/1992 | Heung | 361/384 |
| 5,196,989 | 3/1993 | Zsolnay | 361/383 |

FOREIGN PATENT DOCUMENTS 306696 12/1988 Japan .................. 361/384

Primary Examiner—Gerald P. Tolin
Attorney, Agent, or Firm—Antonelli, Terry, Stout & Kraus

[57] ABSTRACT

In a cooling apparatus of an electronic equipment, a plurality each of integrated circuit devices and large-scale integrated circuit devices are mounted onto a plurality of substrates, respectively, and a cooling fan supplies cooling air from outside to each of these integrated circuit devices. A duct having a comb-tooth shape suitable for encompassing each substrate and defining flow paths along the substrates introduces the cooling air supplied by the cooling fan to each of the integrated circuit devices. The duct includes a plurality of small holes disposed at positions corresponding to the positions of the integrated circuit devices on the substrates and having open areas corresponding to the heating values of the integrated circuit devices. The small holes flow the cooling air supplied by the cooling fan as jet streams to the integrated circuit devices. This jet stream cooling improves cooling performance and can make uniform the temperature distribution of the integrated circuit devices.

3 Claims, 18 Drawing Sheets

F.I G.13

COOLING APPARATUS OF ELECTRONIC EQUIPMENT

This application is a continuation of Ser. No. 07/782,094 filed Oct. 24, 1991, which is now abandoned.

BACKGROUND OF THE INVENTION

This invention relates to a cooling apparatus in an electronic equipment such as a computer.

A cooling apparatus of IC chips in an electronic equipment such as a computer is disclosed, for example, in JP-A-64-28896. In this prior art reference, a common air cooling device cools all the devices by parallel flow cooling when devices having low heat flux, and devices having high heat flux exist in mixture; and a concentrated air cooling device effects jet stream cooling for the devices having high heat flux. In other words, this technique needs a duct besides the substrates and two kinds of fans for the concentrated air cooling device and the common air cooling device. A cooling apparatus for individually cooling circuit devices by the use of small fans is described in JP-A-1-151296, for example. This technique fits a microfan to each of the electronic components and effects cooling only by these microfans. In other words, the same number of microfans as the number of the electronic components are necessary. As another prior art reference of this kind, mention can be made of JP-A-62-72149.

All the prior art techniques described above do not very much consider effective utilization of a cooling fluid directed mainly to uniform cooling of chips, and a problem is yet to be solved from the aspect of effective utilization of the cooling fluid in that reliability of IC chips should be secured by limiting the temperature rise of the IC chips having high heat flux on the substrates. These techniques do not either consider a system configuration of a jet stream cooling apparatus inclusive of a package casing. Accordingly, improvements have yet to be made in the effective utilization method of the cooling fluid, the reduction of noise and a fitting method of the jet stream cooling apparatus.

SUMMARY OF THE INVENTION

It is a first object of the present invention to provide a cooling apparatus capable of supplying a cooling fluid in accordance with a heating value of each IC chip.

It is a second object of the present invention to provide a cooling apparatus capable of minimizing a temperature distribution in both-side and one side packages of IC chips.

It is a third object of the present invention to provide a cooling apparatus capable of improving cooling performance and making a temperature distribution uniform.

It is a fourth object of the present invention to provide a cooling apparatus capable of being easily fitted to and removed from a computer.

It is a fifth object of the present invention to provide a cooling apparatus capable of reducing noise inside a package casing.

To accomplish the first object described above, the cooling apparatus of the present invention includes a comb-toothed feed duct removably fitted to a jet stream cooling apparatus and sets a feed area so that a cooling fluid can be supplied in accordance with the heating value of each of the LSI packages and IC chips and cools the IC chips and LSI packages mounted onto substrates.

To accomplish the second object, the cooling apparatus of the present invention changes the shape of the comb-toothed feed duct and the diameter of jet holes, and can be applied to both-side and one-side packages.

To accomplish the third object, the cooling apparatus of the present invention fits small fans, axial fans, large propellers, etc., each equipped with a temperature sensor, to the comb-toothed feed duct.

The cooling apparatus of the present invention fits the small fans, the axial fans, flat sheet motors, and the like, to the substrates, detects their temperatures by respective temperature sensors and controls the number of revolutions of these fans and motors on the basis of the detection values.

The cooling apparatus of the present invention fits the small fan to each LSI package so that a jet stream is allowed to impinge against the parallel flat sheet fan and pin fins.

The cooling apparatus of the present invention disposes heat conductive members inside and on the surface of the substrates so as to radiate altogether the generated heat.

The cooling apparatus of the present invention interposes a wing-shaped slit plate between the substrates.

The cooling apparatus of the present invention mounts parallel flat sheet fins onto the IC chips, and the like.

To accomplish the fourth object described above, the cooling apparatus of the present invention shapes the feed duct into a removable duct and assembles it into a package casing.

To accomplish the fifth object, the cooling apparatus of the present invention disposes a sound proofing wall outside the cooling apparatus.

The feed area of the comb-toothed feed duct which is removably fitted to the cooling apparatus, is set in such a manner as to supply the cooling fluid in accordance with the heating value. Therefore, the cooling fluid can be supplied in accordance with the heating value of each of the IC chips and LSI chips mounted to the substrates, and cooling performance can be secured. The temperature distribution between the chips can be reduced even in both-side and one-side packages by changing the shape of the comb-toothed feed duct and the diameter of jet holes.

Compulsive cooling can be carried out; higher cooling performance can be obtained and the temperature distribution can be made uniform because the small fans, the axial fans, the large propellers, etc., each equipped with a temperature sensor, are fitted to the comb-toothed feed duct.

The small fans, the axial fans, the flat sheet motors, etc., are mounted to the substrates, and their number of revolution is controlled by detecting the temperature by the respective temperature sensors. Accordingly, the temperature distribution of the IC chips can be made uniform.

The small fan is mounted to each LSI package, and the jet stream is allowed to impinge against the parallel flat sheet fins and pin fins. Accordingly, compulsive cooling can be carried out; the heat transfer coefficient with the fluid can be improved, and cooling performance of the fins themselves can be improved.

Since the heat conductive member is disposed inside and on the surface of the substrate, heat can be transferred, and heat radiation can be made altogether. Accordingly, the temperature distribution of the IC chips and the LSI packages can be made uniform.

Since the wing-shaped slit plate is interposed between the substrates, an unnecessary cooling fluid can be eliminated, and the increase of a pressure loss due to the peel of the fluid can be prevented.

Cooling performance can be improved at a low cost by mounting the parallel flat sheet fins to the IC chip, or the like.

The feed duct is a removable duct and is assembled in the package casing. Therefore, the feed duct alone can be removed easily at the time of repair.

Since the sound proofing wall is disposed outside the jet stream cooling apparatus, the noise resulting from the rotation of the fans can be prevented from being emitted outside.

According to the present invention, first, the comb-toothed feed duct fitted removably to the jet stream cooling apparatus is allowed to supply the cooling fluid in accordance with the heating value. Accordingly, cooling performance of the IC chips and LSI packages mounted onto the substrates can be improved, and reliability can be secured.

Secondly, the temperature distribution between the chips can be minimized in both both-side package and one-side package by changing the shape of the comb-toothed feed duct and the diameter of the jet holes.

Thirdly, cooling performance can be further improved and the temperature distribution can be made uniform by fitting the small fans, the axial fans, the large propellers, etc.; each equipped with a temperature sensor, to the comb-toothed feed duct.

Additionally, the temperature distribution of the IC chips can be made uniform, and cooling performance can be further imp, roved by fitting the small fans, the axial fans, the flat sheet motors, etc., to the substrates, detecting their temperatures by the temperature sensors, and controlling their number of revolutions by the detection values.

Additionally, the small fan is mounted to each LSI package so that the jet stream impinges against the parallel flat sheet fins and the pin fins. In this way, the heat transfer coefficient with the fluid can be improved and cooling performance of the fins themselves can be improved. Reliability of the LSI package can thus be secured.

Additionally, the heat conductive member is disposed inside and on the surface of the substrate so as to radiate altogether the heat. In this way, the temperature distribution of the IC chips and LSI packages can be made uniform, and reliability can be secured.

Additionally, unnecessary cooling fluid can be eliminated, and the increase of the pressure loss due to the peel of the flow can be prevented by interposing the wing-shaped slit plate between the substrates. In other words, cooling performance of the IC chips can be improved.

Cooling performance can be improved at a low cost by mounting the parallel flat sheet fins to the jet stream cooling apparatus.

Since the sound proofing wall is disposed outside the jet stream cooling apparatus, the noise resulting from the rotation of the fans is prevented from being emitted outside. Accordingly, low noise and a pleasant environment can be accomplished.

Further, the feed duct is removable and can be assembled into the package casing. Therefore, only the feed duct can be removed easily at the time of the repair work, and the number of man-hours can be reduced.

DESCRIPTION OF THE PREFERRED EMBODIMENTS

Figure 1:
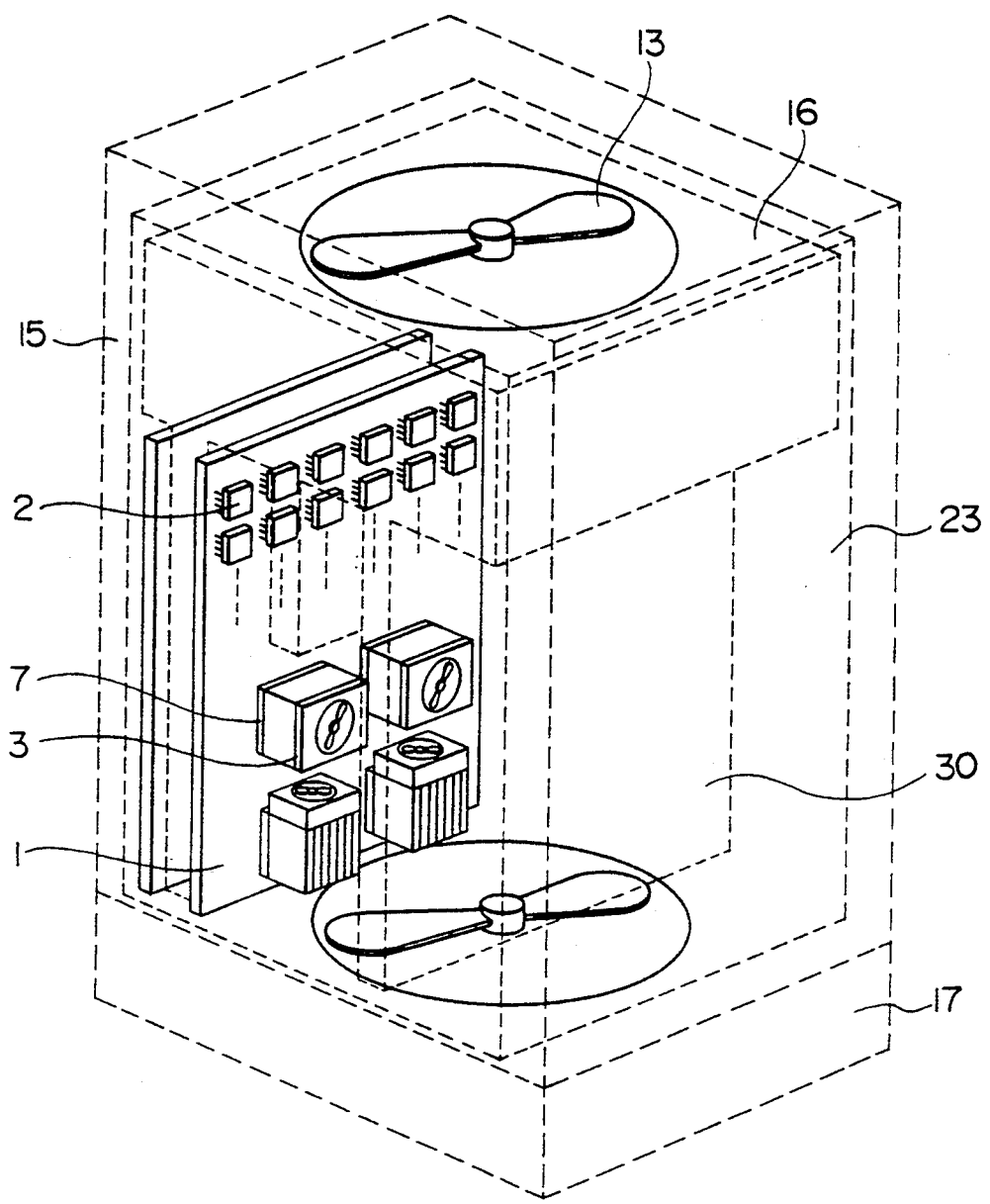
FIG. 1 shows an overall structure of a cooling apparatus of the present invention assembled into a computer.

A first embodiment of the present invention will be described with reference to FIGS. 1 to 6. FIG. 1 shows an overall structure of a cooling apparatus of the present invention which is assembled into a compact high performance computer 15.

A plurality of substrates 1, each having a plurality of IC chips 2 and a plurality of LSI packages 7 mounted thereto, are in turn mounted to the compact high performance computer. The cooling apparatus includes a fan 13 for supplying a cooling fluid between the substrates 1 that are substantially juxtaposed, a feed duct 30 disposed at an upper portion and an exhaust port 17 disposed at a lower portion.

A small fan 3 is fitted to the substrate 1 appropriately at a position where cooling is necessary, and a sound proofing wall 23 is so disposed as to encompass the fan, and the like. A jet cooler 16 represented by dashed line in FIG. 1 is removable so that when a heating value of the IC chip groups 2 on the substrate 1 is low; this jet cooler 16 is removed; and parallel flow cooling can be made by a fan 13.

Figure 2:
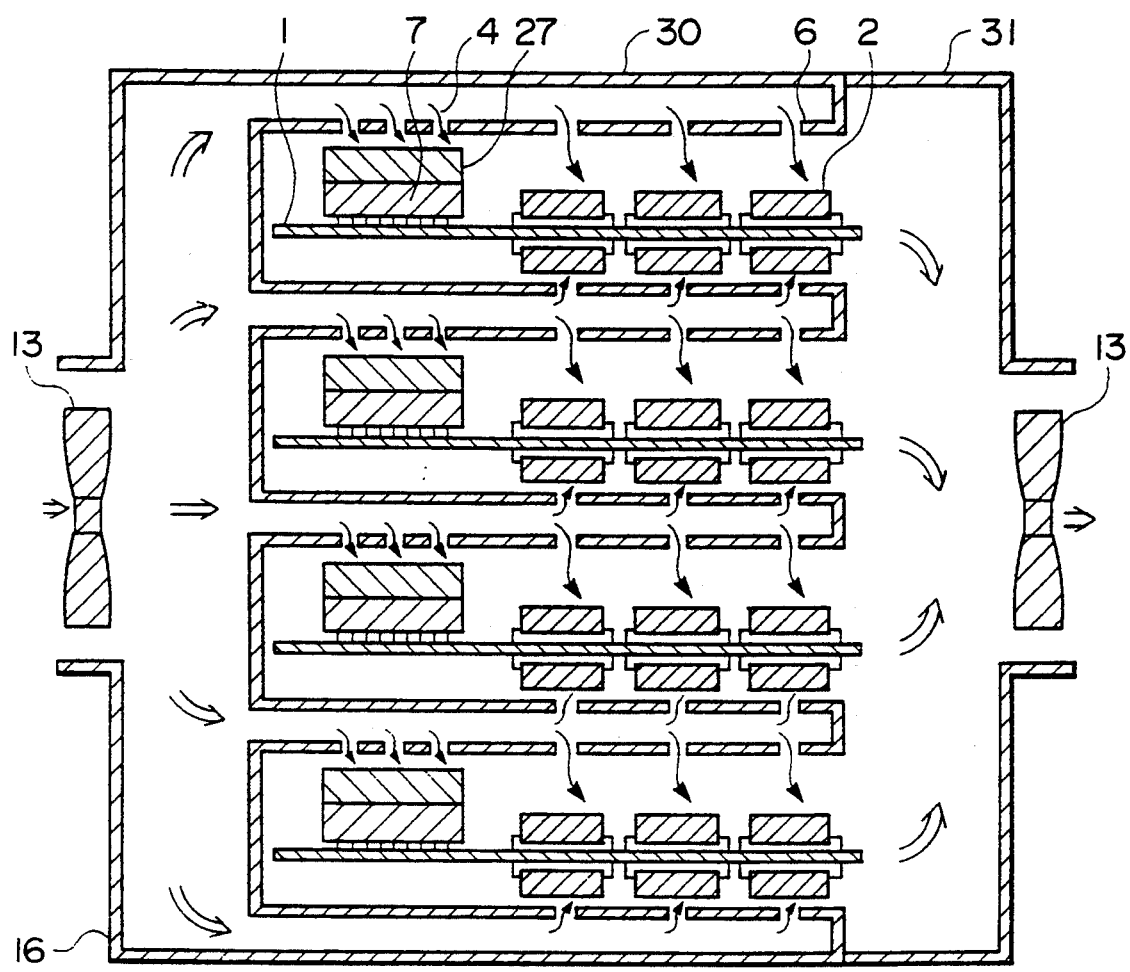
FIG. 2 shows a structure of a first embodiment of the cooling apparatus of the present invention.

FIG. 2 shows the structure of a first embodiment of the cooling apparatus of the present invention.

A plurality of IC chips 2 and a plurality of LSI packages 7 are mounted onto both surfaces of each substrate 1. A heat radiation fin 27 is fitted to each LSI package 7. A feed duct 30 is shaped in a continuous ]-shape or is bent into a comb-tooth so that the LSI packages 7, the heat radiation fins 27 and the IC chips 2 are positioned between the ]-shape or the comb-teeth. The cooling fluid (which is ordinarily the air) introduced by the feed fan 13 is supplied to the LSI packages 7 and the IC chips 2 through the feed duct, respectively.

The fan 13 is disposed at the inlet portion of the feed duct 30 and supplies the cooling fluid. A plurality of small holes 6 are bored at the comb-tooth portions of the feed duct 30, and the cooling fluid impinges as a jet stream 4 against the groups of the LSI packages 7 and IC chips 2 mounted on the substrate 1 through these small holes 6. In other words, the great cooling effect of the jet stream 4 can drastically reduce the temperature rise of the groups of the LSI packages 7 and IC chips 2.

A plurality of small holes 6 are disposed at the comb-tooth portions for one LSI package so that the flowing area of the cooling fluid becomes great at the portions where the heat flux density is high, such as on the LSI package 7.

An exhaust duct 31 is disposed downstream of the feed duct 30. After cooling the LSI packages 7 and the IC chips 2, the cooling fluid is exhausted outside by the fan 13.

The heat radiation fin 27 shown in FIG. 2 can be replaced by the small fan in order to further improve the cooling effect.

Figure 3:
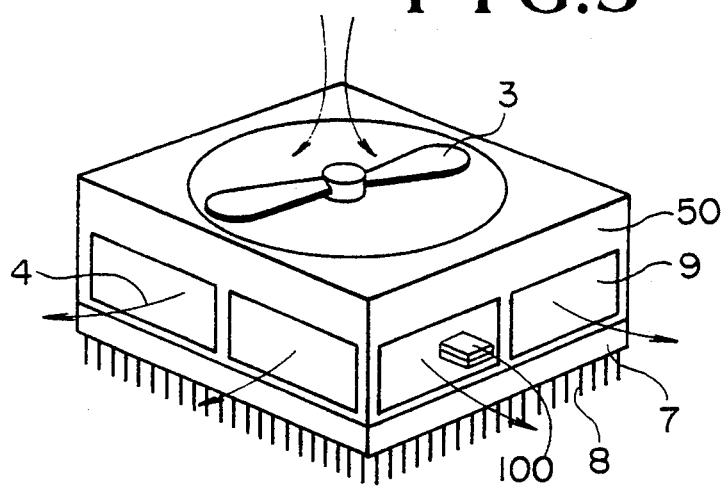
FIG. 3 shows a first example of a small fan mounted to an LSI package of FIG. 2.

FIG. 3 shows an embodiment wherein the small fan 3 is mounted onto a high heat flux LSI package 7. Power is supplied to the LSI package 7 through lead pins 8. The small fan 3 is driven by a driving motor, not shown in the drawing. Fluid ports 9 at the upper part of the LSI package 7 are fitted to a block 50 disposed in a peripheral direction. According to this construction, the cooling fluid can be converted to the jet stream 4 by the small fan 3 and is caused to impinge against the LSI package 7. After removing the heat from the LSI package 7, the fluid can be emitted outside through the fluid holes 9. Accordingly, the cooling performance of the LSI package 7 can be improved.

Figure 4:
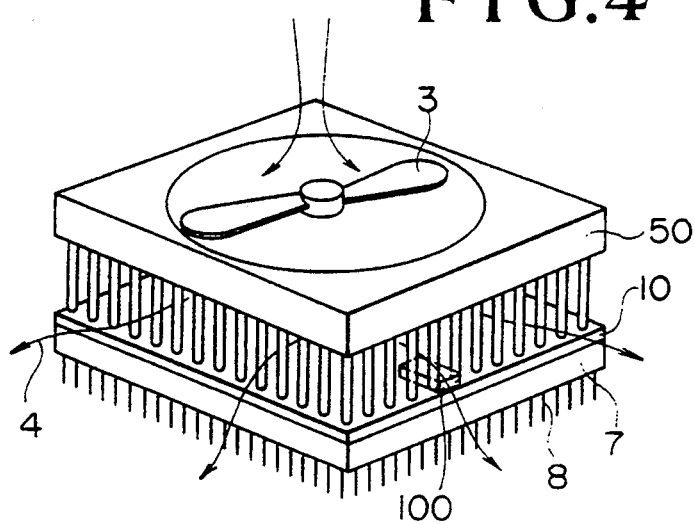
FIG. 4 shows a second example of the small fan mounted to the LSI package of FIG. 2.

The revolutions of the small fan 3 may be controlled by disposing a temperature sensor 100 such as a thermosensitive diode (thermistor) on the small fan 3. In this case, the temperature change of the LSI package 7 can be kept substantially constant.

Where the cooling performance of the LSI package 7 must be further improved, it is advisable to dispose pin fins 10 on the LSI package 7 as shown in FIG. 4 and then to dispose the small fan 3 on these pin fins 10. In this case too, the revolutions of the small fan 3 are controlled and changed on the basis of a detection value by detecting the temperature of the bottom of the LSI package 7 or the pin fins 10. If the pin fins 10 are disposed in this way, the heat radiation area can be increased, and furthermore, since the heat transfer coefficient with the fluid increases, the cooling performance can be further improved. When the pin fins 10 are employed, the cooling fluid is allowed to outflow in an arbitrary direction in the peripheral direction. Therefore, there is the advantage that the fluid the temperature which rises due to the heat radiation from the LSI package 7 can be immediately emitted outside.

As described above, this embodiment can further improve the cooling performance of the LSI package 7 and can secure reliability of the LSI package 7.

Figure 5:
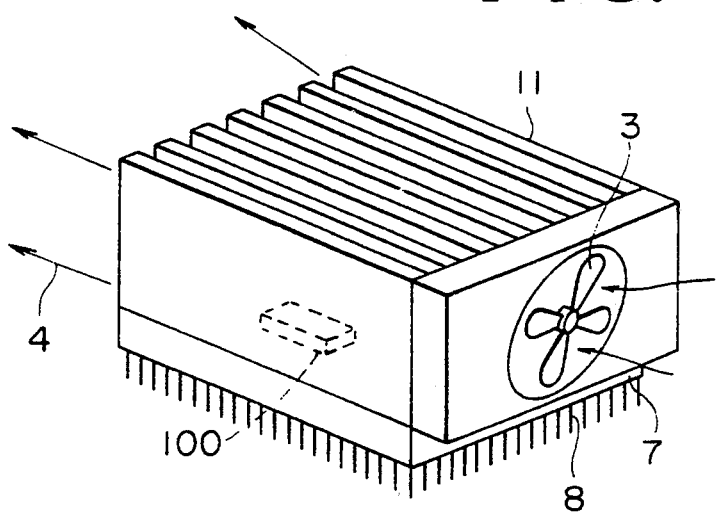
FIG. 5 shows a third example of the small fan mounted to the LSI package of FIG. 2.

FIG. 5 shows the case where parallel flat sheet fins 11 are juxtaposed. In this embodiment, the parallel flat sheet fins 11 are disposed on the LSI package 7 and the small fan 3 is disposed in the transverse direction so that the cooling fluid flows between the fins. The cooling fluid flowing between the fins is ordinarily limited, but when the parallel flat sheet fins 11 are used, their cooling performance can be further improved by passing the cooling fluid from the small fan 3 between these fins. The number of revolutions of the motor for driving the small fan 3 may be controlled by the temperature sensor 100 buried into the LSI package 7 or into the bottom of the parallel flat sheet fins 11.

The cooling fluid can be utilized more efficiently by mounting the small fan 3 onto the LSI package 7 as described above, so that the cooling performance of the LSI package 7 can be improved and reliability can be secured, as well.

The operation of the cooling apparatus of the present invention will now be explained. The fan 13 rotates and sends the cooling fluid to the feed duct 30 after or before the compact high performance computer 15 starts its operation. Since the flow path of the feed duct 30 is so disposed as to encompass each substrate 1 as described already, the cooling fluid is distributed to each flow path in accordance with the flow rate on its upstream side, and flows inside each flow path. The feed duct 30 is provided with the small holes 6 in such a manner as to set the flow rate of the cooling fluid in accordance with the heating value of the LSI packages 7 and IC chips 2. Therefore, a greater quantity of the cooling fluid is supplied to the LSI packages 7 having a greater heating value. The cooling fluid which cools the LSI packages 7 and the IC chips 2 on the upstream side and whose temperature therefore rises flows to the downstream side. Since the cooling fluid which is not yet overheated is supplied sequentially through the small holes 6 and is cooled by the jet stream, however, the LSI packages 7 and the IC chips 2 can be cooled without being much affected by the cooling fluid on the upstream side whose temperature has risen.

The small fans 3 are appropriately disposed on the specific LSI packages 7 or IC chips having a large heat value. Accordingly, the cooling fluid can be forcedly supplied and the cooling performance can be improved.

The temperature of the LSI packages 7 can be controlled to a substantially constant temperature by controlling the number of revolutions of the small fan 3 on the basis of the temperature detected by the temperature sensor.

After cooling the LSI packages 7 and the IC chips 2 in the manner described above, the cooling fluid is exhausted outside by the fan 13 through the exhaust duct 31.

Figure 6:
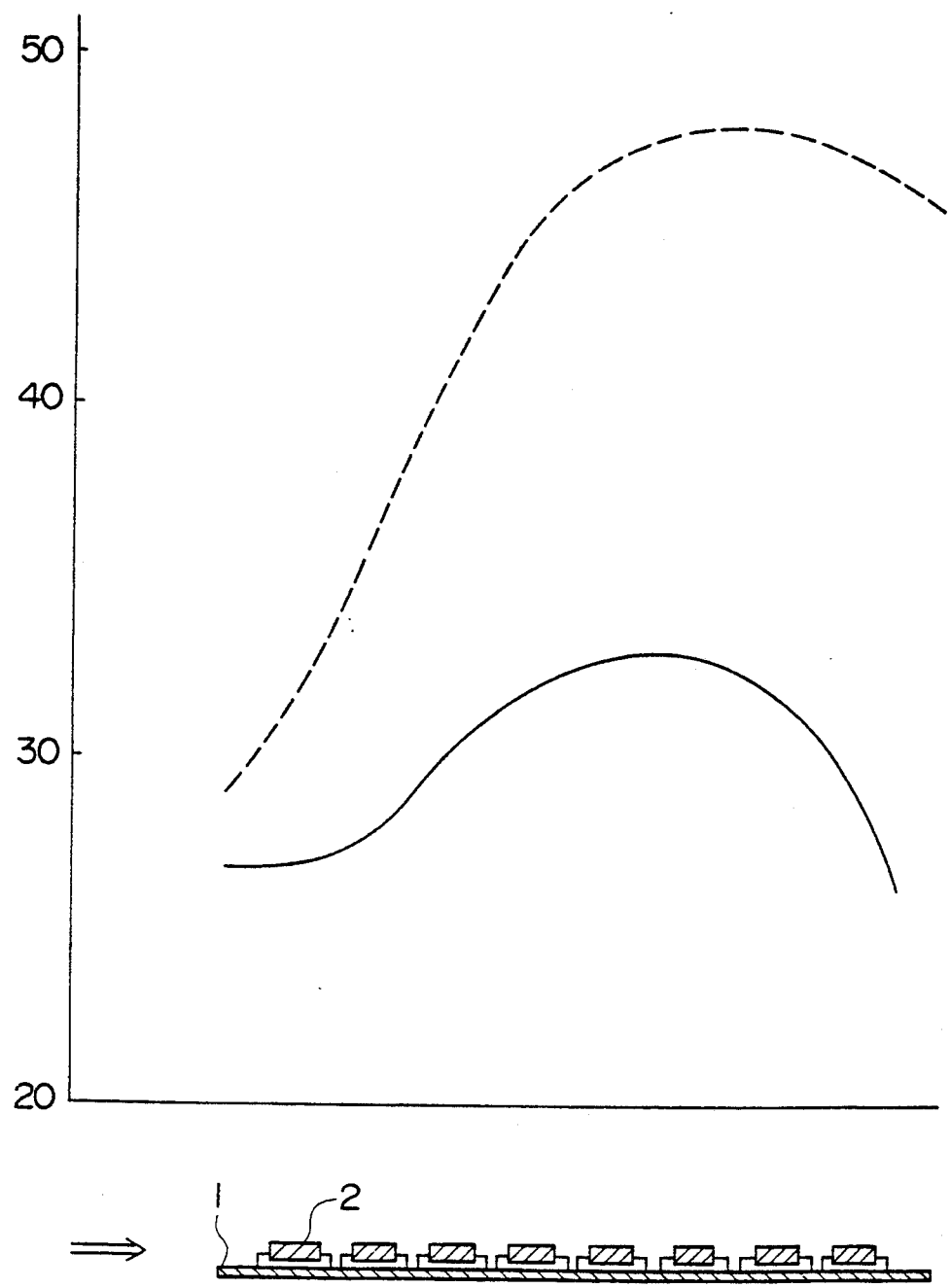
FIG. 6 shows a temperature distribution in a flowing direction of an IC chip group in the first embodiment of the present invention in comparison with parallel flow cooling of the prior art.

FIG. 6 shows the temperature distribution with respect to the flowing direction of the groups of the IC chips 2 in the first embodiment of the present invention in comparison with parallel flow cooling of the prior art. The abscissa represents the distance in the flowing direction, and the ordinate represents a temperature difference $\Delta T = (T_j - T_a)$. Here, $T_j$ is the internal temperature of the IC chip, and $T_a$ is the intake temperature. The maximum temperature difference is $\Delta T_{max} = 48$ (deg) in the case of parallel flow cooling. This is because the fluid whose temperature has risen due to the heat radiation of the IC chips 2, and the fluid which does not contribute to cooling exist in mixture. When the embodiment of the invention is applied, in contrast, the maximum temperature difference is $\Delta T_{max} = 33$ (deg), which is about ⅔ of that of parallel flow cooling, and the temperature distribution can be made more uniform.

As described above, the cooling performance of the groups of the IC chips 2 can be improved by causing the cooling fluid to impinge against each group of the IC chips 2 in the form of the jet stream 4 in accordance the heating value of the IC chips 2, and in this way, the temperature distribution of the IC chips 2 on each substrate 1 can be made uniform. Since mixing of the cooling fluid, too, can be made efficiently, the capacity of the fan 13 may be extremely small and power consumption can be reduced.

The sound proofing wall 23 is disposed outside the jet cooling apparatus 16 so as to prevent the emission of noise due to the rotation of the fan 3. Therefore, noise reduction, too, can be improved.

In the first embodiment shown in FIG. 2, jet stream cooling may be carried out by using only the feed duct 30 by removing the exhaust duct 31. In this case, since the exhaust duct 31 does not exist, the cooling apparatus can be made compact and since only one fan 13 is used, noise and power consumption can be reduced.

Figure 7:
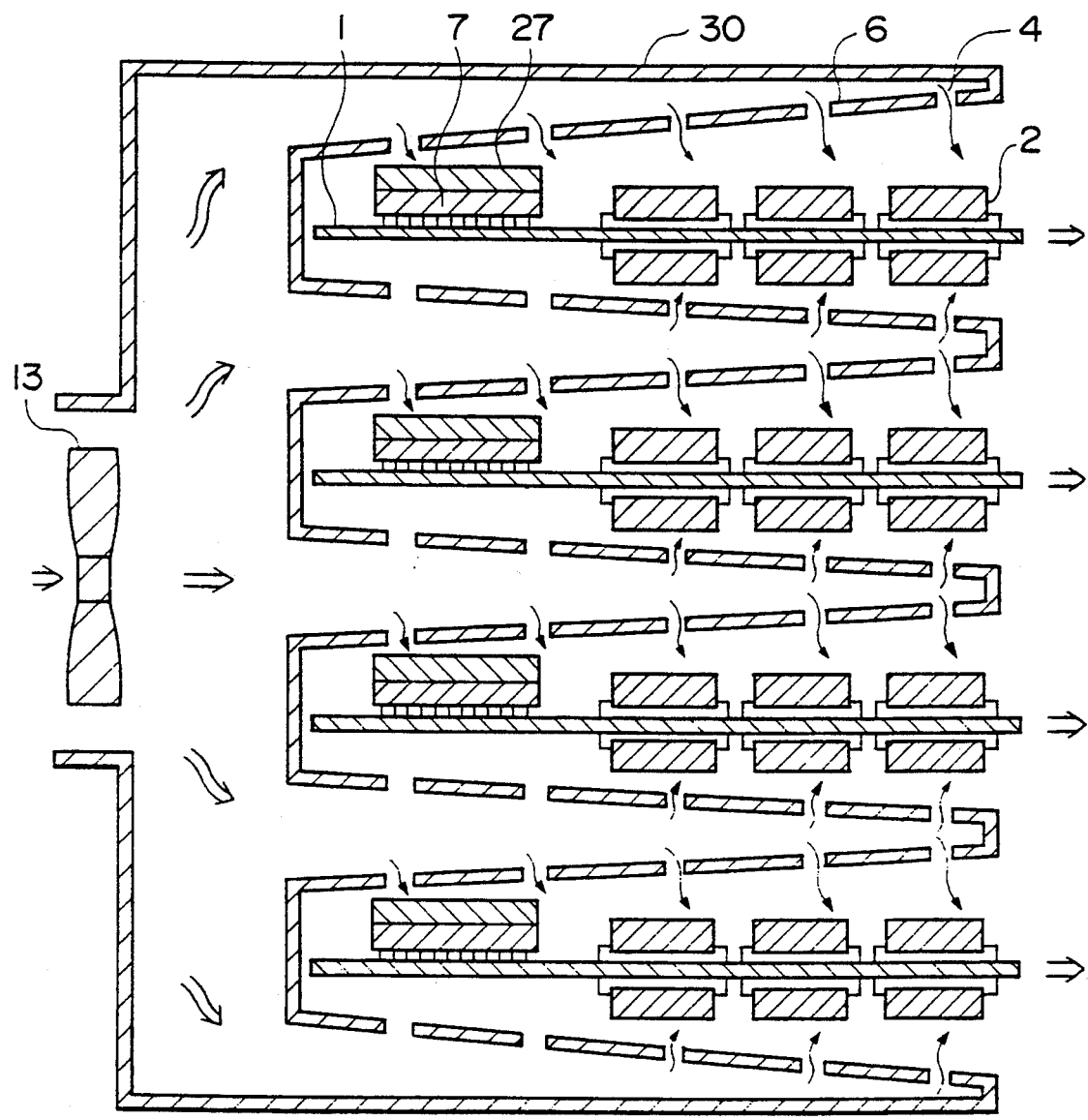
FIG. 7 shows a structure of a second embodiment of the cooling apparatus of the present invention.

FIG. 7 shows the second embodiment of the present invention. In this embodiment, the flow rate regulation of the cooling fluid to be supplied to the individual IC chips, etc, is changed by the flow path area of the feed duct in the flowing direction.

In the embodiment shown in FIG. 7, the feed duct 30 is shaped in such a manner that the cooling flow path for supplying the jet strewn to the LSI packages 7 and the IC chips 2 becomes progressively smaller towards the downstream direction. In FIG. 7, the LSI packages 7 disposed on each substrate 1 have a greater heating value than those shown in FIG. 2 and are positioned on a more upstream side. In other words, if the LSI packages 7 having a greater heating value are placed on the upstream side, a greater quantity of the cooling fluid can be caused to impinge against them by enlarging the flow path on the upstream side.

Where the LSI packages 7 having a greater heating value are disposed on the downstream side, or where the IC chips disposed on the downstream side have a great temperature rise, the feed duct 30 may be shaped such that the flow path becomes progressively greater towards the downstream side, in contrast to the structure shown in FIG. 7.

According to the construction described above, a great quantity of the fresh cooling fluid impinges against the IC chips and hence, the cooling performance on the downstream side can be improved.

If the IC chips 2, etc, have an equivalent heating value, the diameters of the small holes 6 of the feed duct 30 may be set to the same diameter.

Figure 8:
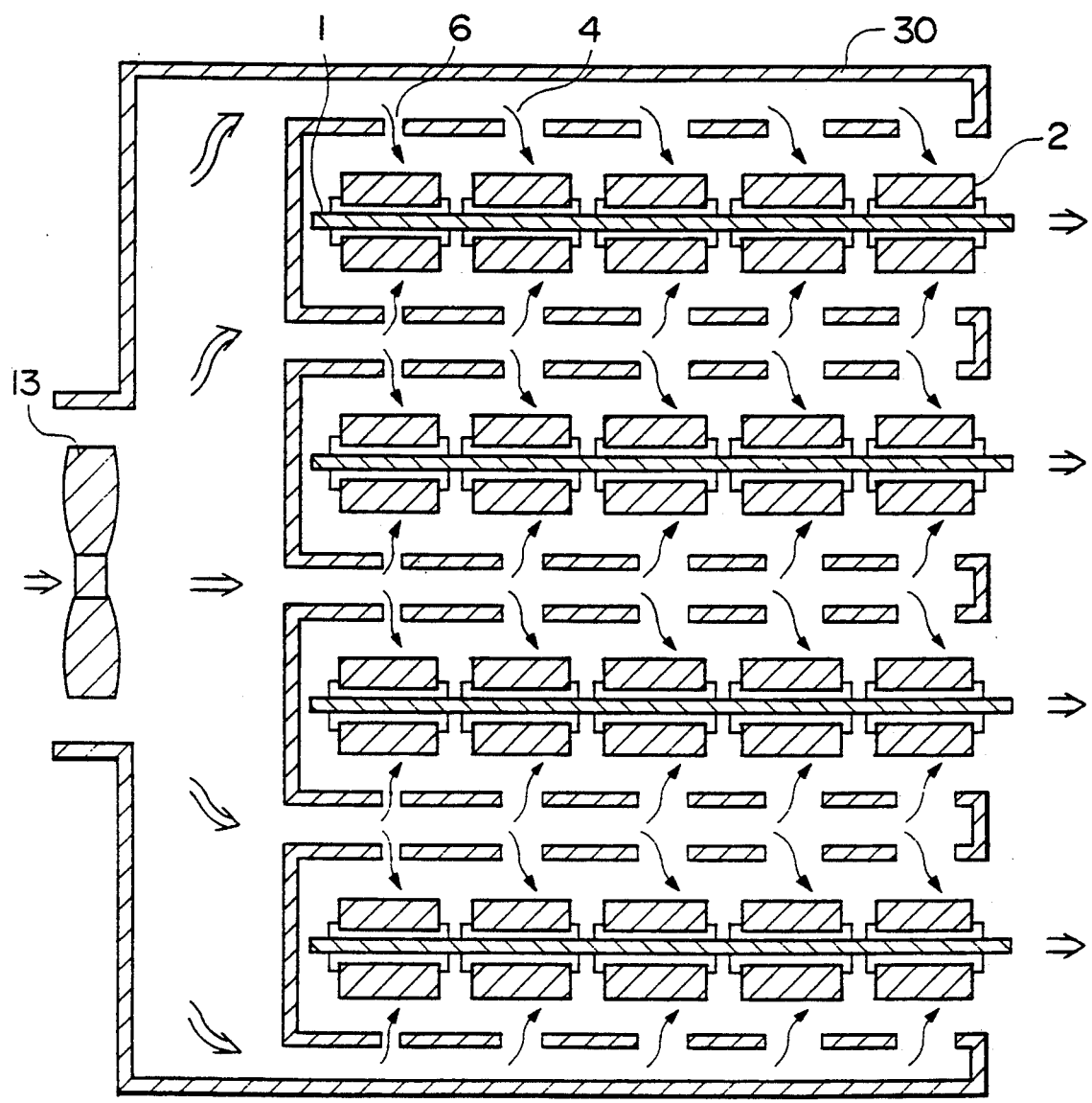
FIG. 8 shows a structure of a third embodiment of the cooling apparatus of the present invention.
Figure 9:
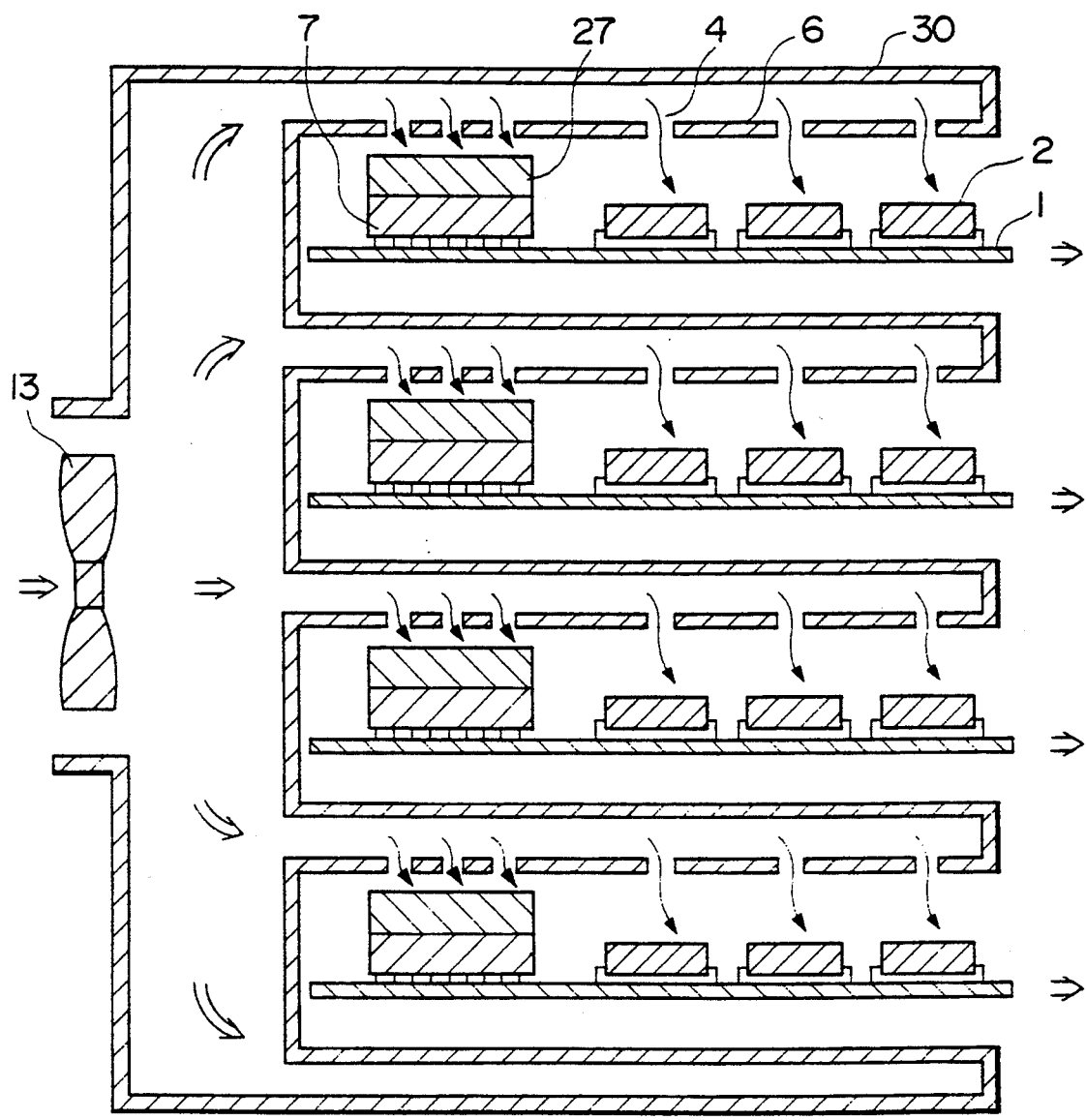
FIG. 9 shows a structure of a fourth embodiment of the cooling apparatus of the present invention.

FIGS. 8 and 9 show other embodiments of the present invention, wherein the flow path area of the small holes 6 bored in the feed duct 30 is changed to regulate the flow rate of the cooling fluid.

FIG. 8 shows the third embodiment of the present invention, where the diameters of the small holes 6 of the feed duct 30 are made to be progressively larger towards the downstream side. In FIG. 8, where the IC chips on the downstream side of the group of the IC chips 2 mounted onto the substrate 1 have a great heating value or have a high temperature, the diameters of the small holes 6 are increased so that the IC chips 2 can be cooled by the jet stream of a greater quantity of the cooling fluid. This third embodiment makes the temperature distribution of the group of the IC chips 2 uniform.

If the IC chips 2, having a great heating value, exist on the upstream side among the group of the IC chips 2 mounted onto the substrate 1, or if the IC chips 2 on the upstream side have a high temperature rise, the diameters of the small holes 6 boxed in the feed duct 30 on the upstream side are increased so that a greater quantity of the cooling fluid impinges against the IC chips 2, and the temperature distribution of the group of the IC chips 2 is uniform.

Next, FIG. 9 shows the fourth embodiment of the present invention, where the group of the IC chips 2 and the LSI package 7 are mounted to one of the surfaces of the substrate 1. In this fourth embodiment, the small holes 6 are formed on one of the surfaces of the feed duct 30, and the number of these small holes 6 increases at the portion of the LSI package 7 having a great heating value to increase the quantity of the flowing cooling fluid. The present invention can be advantageously used with any packages such as one-side package, both-side package, one-side and both-side mixture package, etc, by disposing the comb-toothed feed duct 30 and by changing the positions, number, etc, of the small holes 6 disposed on the feed duct 30 as described above.

It is thus possible to secure reliability of the groups of the IC chips 2 and the LSI package 7, and to further improve the cooling performance by disposing the comb-toothed feed duct 30 and changing its shape or changing the size of the diameters of the small holes 6 formed in the feed duct 30.

Figure 10:
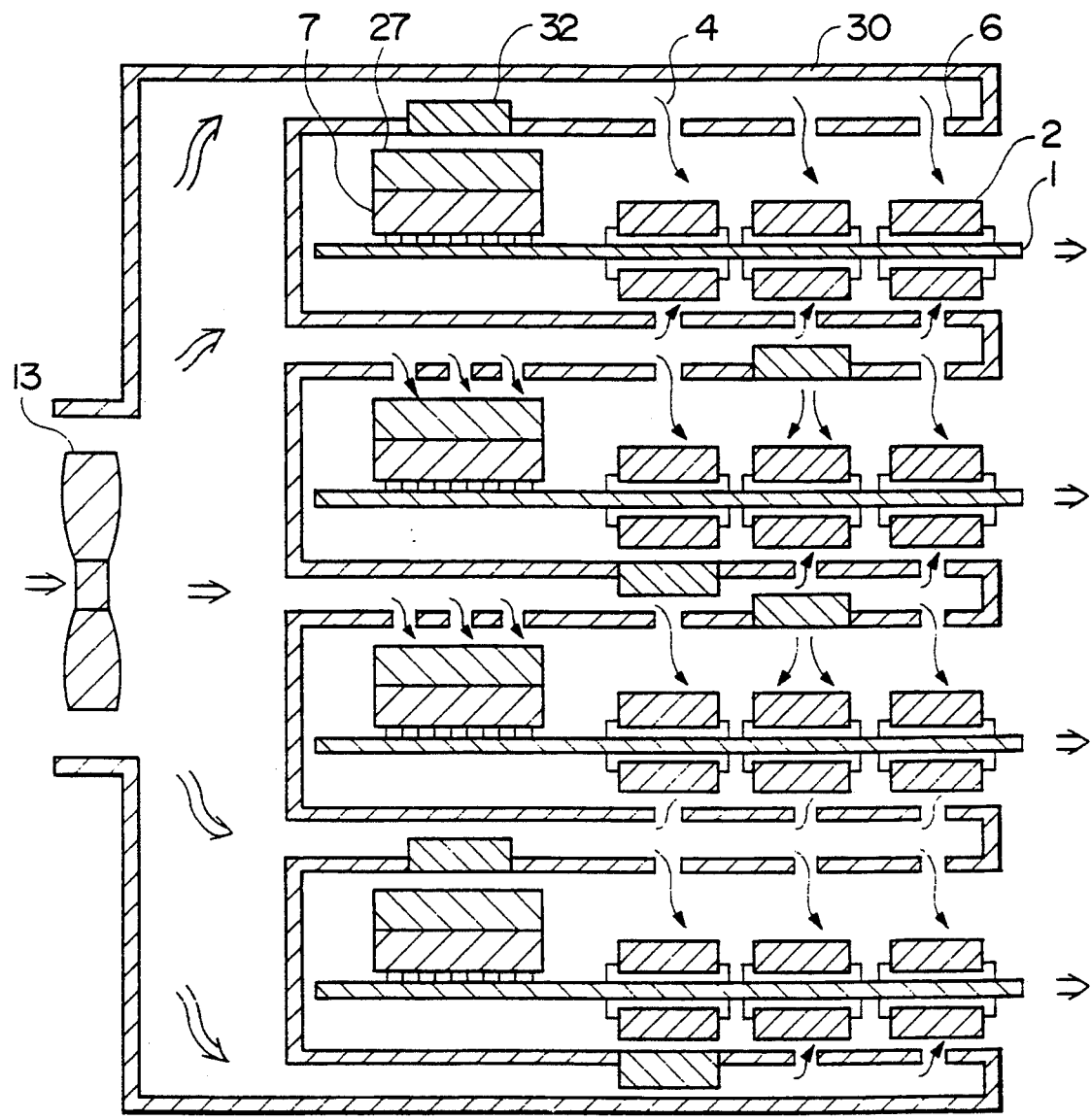
FIG. 10 shows a structure of a fifth embodiment of the cooling apparatus of the present invention.
Figure 11:
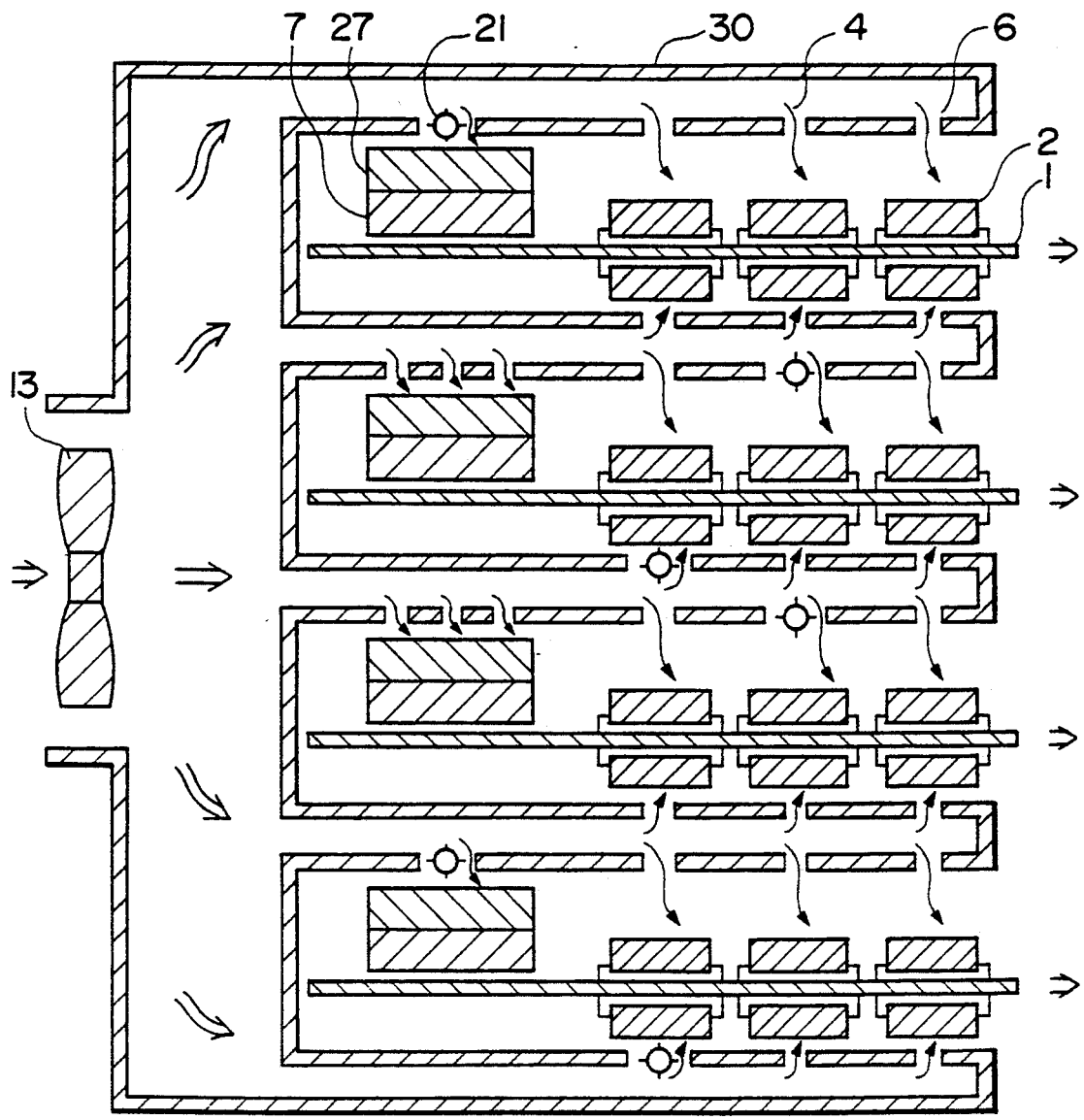
FIG. 11 shows a structure of a sixth embodiment of the cooling apparatus of the present invention.
Figure 12:
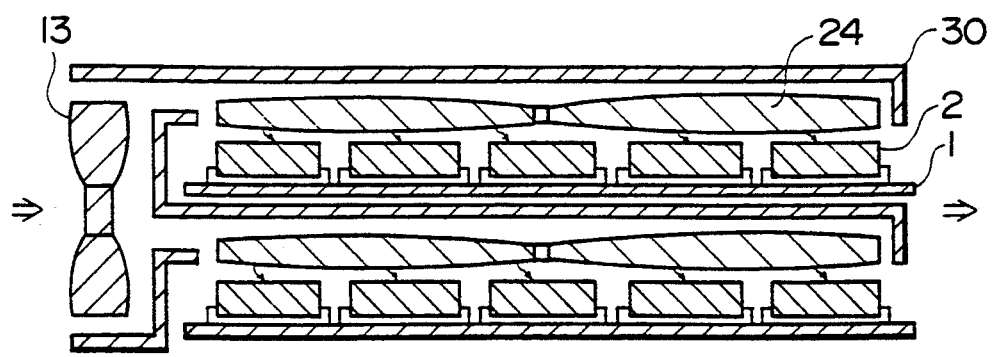
FIG. 12 shows a structure of a seventh embodiment of the cooling apparatus of the present invention.

FIGS. 10 to 12 show other embodiments of the present invention, where the small fan is disposed in the feed duct 30. FIG. 10 shows the fifth embodiment of the present invention, where the small fan 32 is buried in the feed duct 30. In FIG. 10, the LSI package 7 equipped with the heat radiation fin 27 and the group of the IC chips 2 are shown mounted onto each substrate 1. If there are locally any IC chips 2 and LSI package 7 having a large heating value or if their temperature is high, the small fan 32 is buried into the feed duct 30 to further improve the jet stream cooling effect. The number of revolution of this small fan is appropriately controlled on the basis of the temperature detected by a temperature sensor. Since this fifth embodiment can forcedly supply a suitable quantity of the cooling fluid to the specific portions having a great heating value, the temperature distribution of the groups of the IC chips 2 and the LSI package 7 is made uniform; the cooling performance can be further improved, and reliability can be secured.

FIG. 11 shows the sixth embodiment, wherein an axial fan 21 is employed in position of the small fan 32 as shown in FIG. 10. In FIG. 11, the number of revolutions of this axial fan 21 is controlled on the basis of the value detected by the temperature sensor in the same way as in the case of the small fan 32. Since the axial fan 21 is used, the width of the comb-tooth of the feed duct 30 can be further reduces. Accordingly, the package casing can be made compact.

Next, FIG. 12 shows the seventh embodiment of the invention, wherein a large propeller 24 having substantially the same size as that of the substrate 1 is fitted to the feed duct 30 and is rotated so that the cooling fluid, which would not otherwise contribute to cooling, impinges against the group of the IC chips as the swirl flow. In this seventh embodiment, the number of revolutions of the large propeller 24 need not be high. According to this embodiment, the temperature distribution of the group of the IC chips 2 becomes uniform and reliability of the IC chips 2 can be secured.

As described above, the cooling performance can be further improved and reliability can be secured by fitting the small fan 32 to the comb-toothed feed duct 30.

Figure 13:
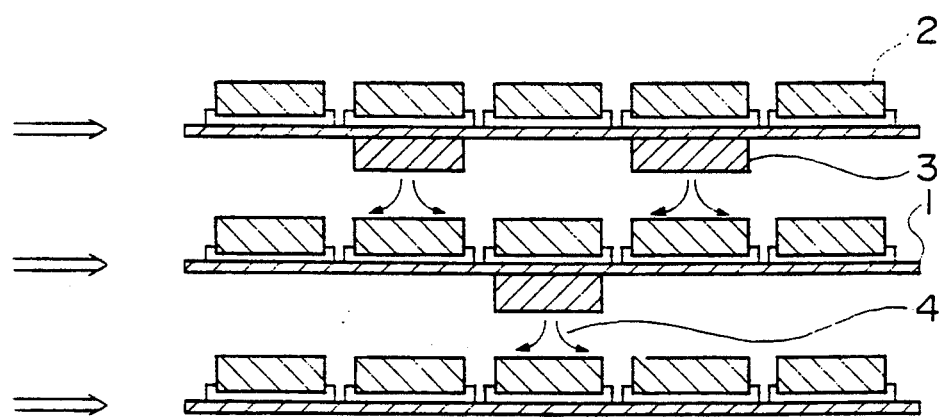
FIG. 13 shows a structure of an eight embodiment of the cooling apparatus of the present invention.

FIGS. 13 to 20 show other embodiments of the present invention, where the small fan is disposed on one of the surfaces of the substrate 1. In FIG. 13, the small fans 3 are shown fitted to the surface of the substrate 1 opposite to the surface on which the IC chips 2, etc, are mounted.

The small fans 3 are disposed at the positions corresponding to the IC chips 2 having high heat flux to the supply of the cold air of the upper layer as the jet stream to the IC chips 2. The eight embodiment of the present invention improves the cooling performance of the IC chips having a large heating value and at the highest portion of the temperature distribution. In other words, due to the effect of the jet stream 4 by the cooling fluid of the upper layer above the substrate 1 whose temperature is not raised, the cooling performance is further improved, and the temperature distribution of the group of the IC chips 2 is made uniform.

Figure 14:
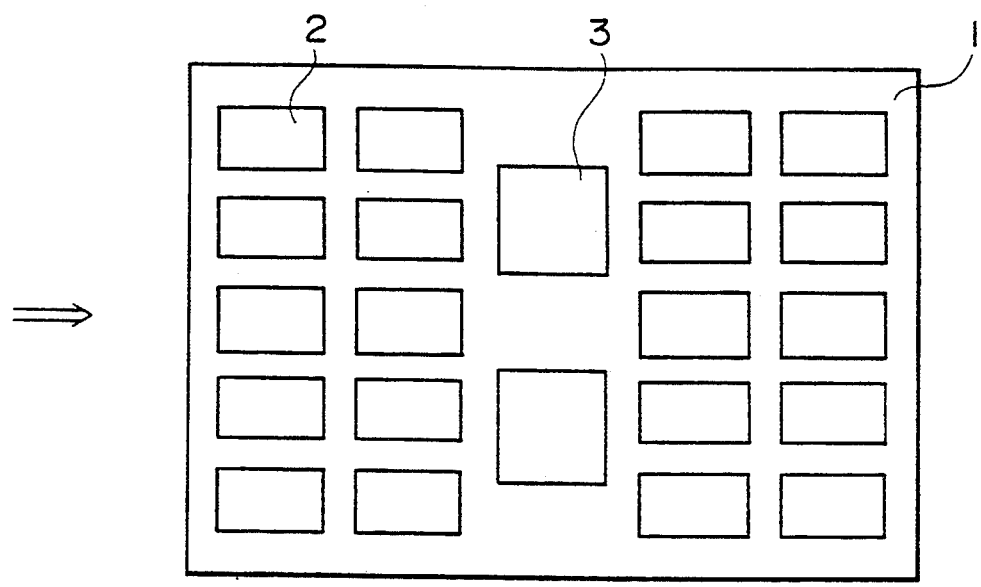
FIG. 14 is a plan view of a structure of a ninth embodiment of the cooling apparatus of the present invention.
Figure 15:
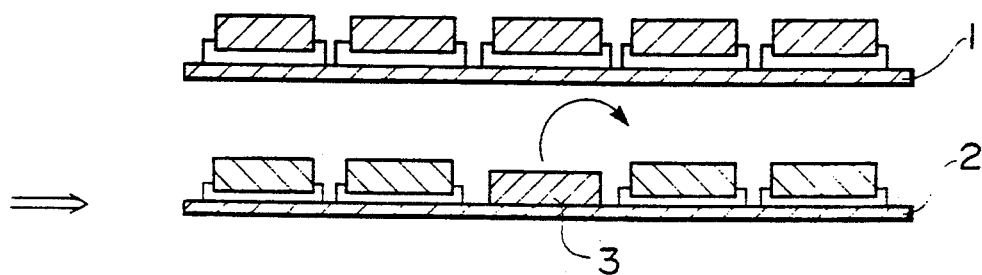
FIG. 15 is a sectional view of a structure of the ninth embodiment of the cooling apparatus of the present invention.

FIGS. 14 and 15 show the ninth embodiment of the present invention, where the small fans 3 are disposed on the same surface of the substrate 1 as the surface on which the IC chips 2 are disposed. The ninth embodiment blows the cooling fluid to the substrates 1 above the substrate of the fans 3, flows away the jet stream 4 to the IC chips having a large heating value by utilizing the cooling fluid that is repelled back, and thus improves the cooling performance.

Figure 16:
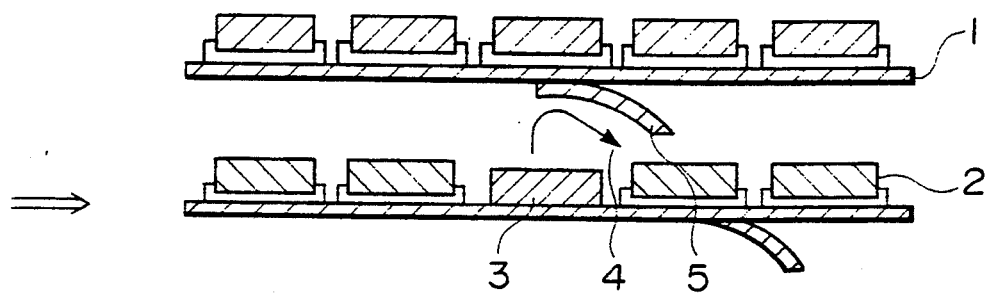
FIG. 16 shows a structure of a tenth embodiment of the cooling apparatus of the present invention.

FIG. 16 shows the tenth embodiment of the present invention, wherein a slit plate or plates 5 are disposed on the surface of the substrate opposed to the surface on which the IC chips 2 are disposed such that the cooling fluid is as the jet stream to the IC chips 2 so that the cooling performance can be much more improved than the ninth embodiment shown in FIGS. 14 and 15. This tenth embodiment can effectively utilize the cooling fluid.

Figure 17:
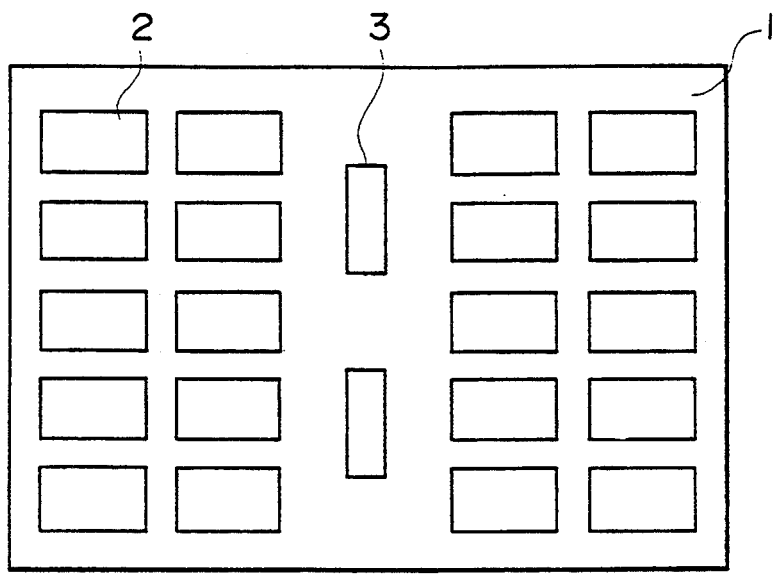
FIG. 17 is a plan view of all eleventh embodiment of the cooling apparatus of the present invention.
Figure 18:
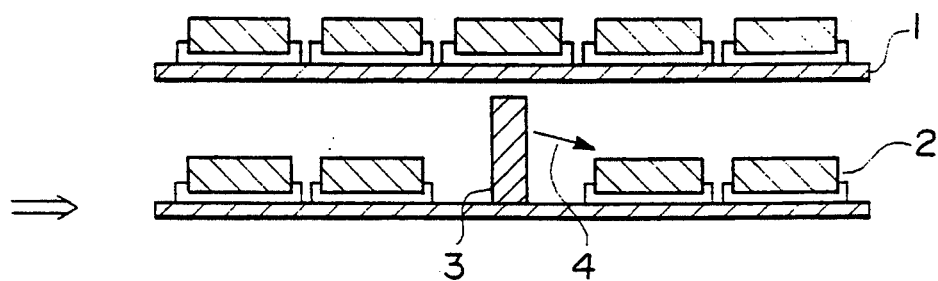
FIG. 18 is a sectional view of a structure of the eleventh embodiment of the cooling apparatus of the present invention.

FIGS. 17 and 18 show the eleventh embodiment of the present invention, where the small fan 3 is vertically disposed on the same surface of the substrate 1 as the surface on which the group of the IC chips 2 are mounted. Since the small fan 3 is vertically disposed, the cooling fluid impinges against the IC chips 2 by mixing the cooling fluid whose temperature has risen due to the heat radiation of the IC chips 2 with the fresh cooling fluid above the substrate 1. This eleventh embodiment lowers the maximum temperature and secures reliability of the IC chips 2.

Figure 19:
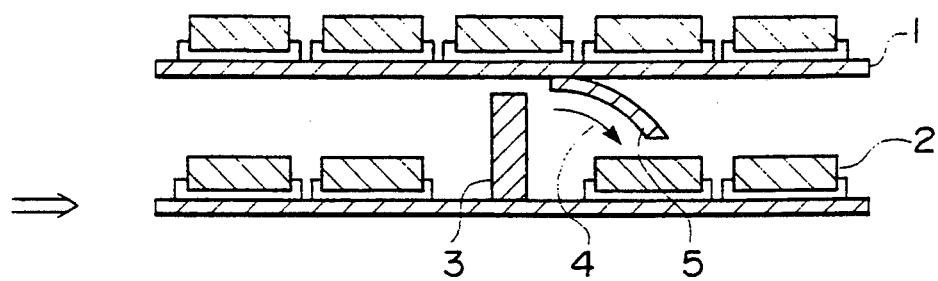
FIG. 19 shows a structure of a twelfth embodiment of the cooling apparatus of the present invention.
Figure 20:
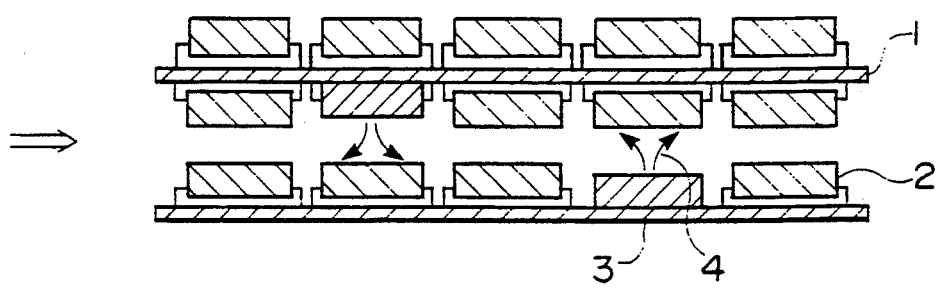
FIG. 20 shows a structure of a thirteenth embodiment of the cooling apparatus of the present invention.

FIG. 19 shows the twelfth embodiment of the present invention, where the slit plate 5 for guiding the cooling fluid is disposed on the surface of the upper substrate 1 opposed to its surface on which the IC chips are mounted, in order to improve the cooling performance much more than the eleventh embodiment shown in FIGS. 17 and 18. The thirteenth embodiment of the present invention shown in FIG. 20, where the small fan 3 is disposed on the same surface of the substrate as the surface on which the IC chips are mounted, can be applied to both-side packages.

FIGS. 21 to 28 show other embodiments of the present invention, where the fans are buried in the substrate to blow the jet stream to the IC chips 2 mounted to the substrate below or above the substrate into which the fans are buried.

Figure 21:
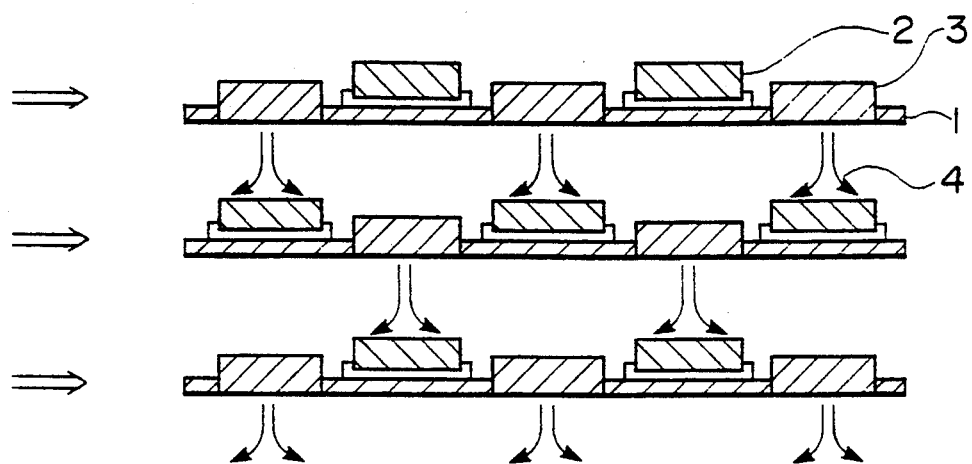
FIG. 21 shows a structure of a fourteenth embodiment of the cooling apparatus of the present invention.

FIG. 21 shows the fourteenth embodiment of the present invention, where the small fans 3 are buried into the substrate at positions which are between the IC chips 2 of the upper substrate and correspond to the positions of the IC chips 2 of the lower substrate having a high heating value or to the IC chips 2 having a high temperature, and the substrates are thus arranged in the multi-layer structure. This fourteenth embodiment destroys the temperature boundary layer due to the heat radiation of the group of the IC chips 2 and effectively utilizes the cooling fluid. Accordingly, the maximum temperature of the group of the IC chips 2 can be reduced and the temperature distribution can be made uniform, as well.

Figure 22:
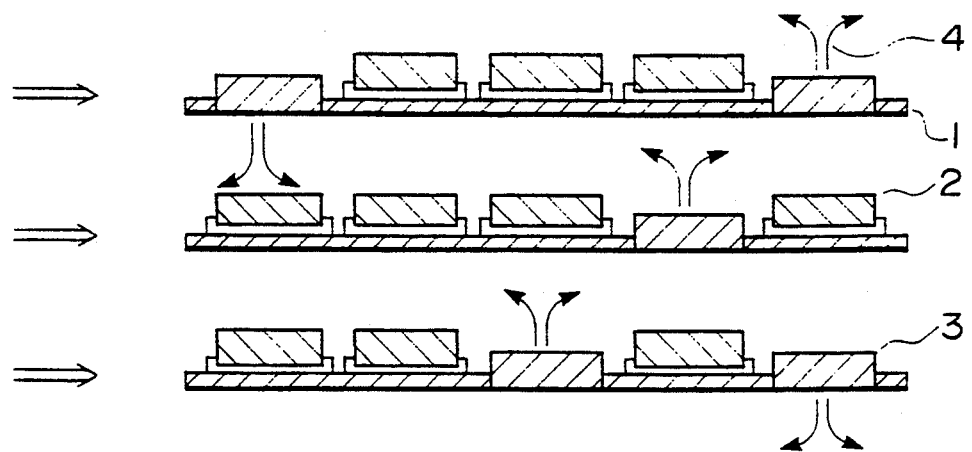
FIG. 22 shows a structure of a fifteenth embodiment of the cooling apparatus of the present invention.

FIG. 22 shows the fifteenth embodiment of the present invention, where the jet stream and suction function of the small fans 3 co-exist so as to destroy the temperature boundary layer. In this fifteenth embodiment, the cooling fluid above the substrate 1 is suctioned by the small fans 3 so that the cooling performance of the IC chips 2 mounted to the upper substrate 1 can be improved, and the temperature distribution of the group of the IC chips 2 can be made uniform.

Figure 23:
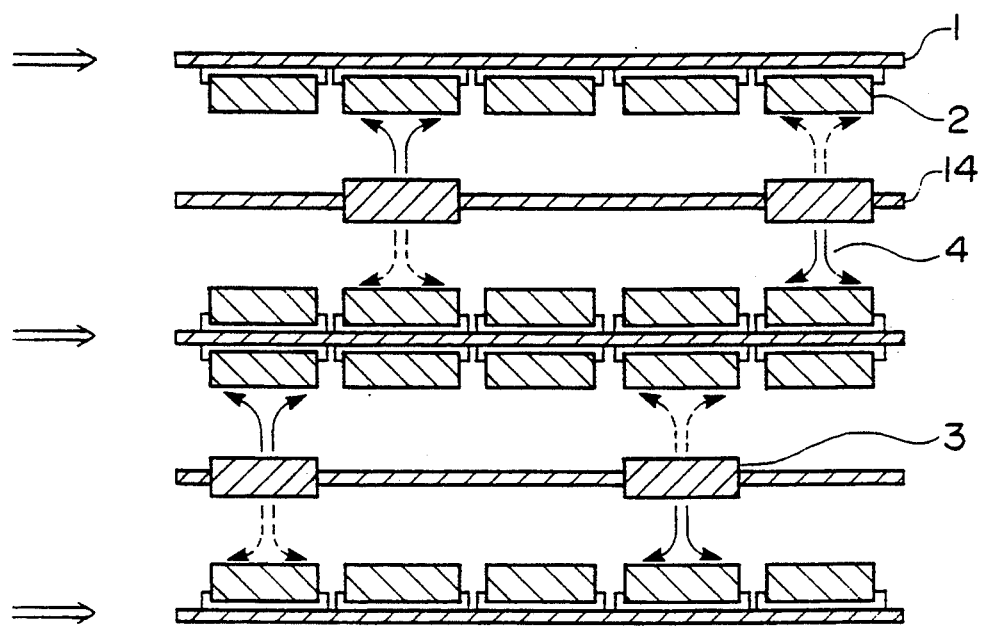
FIG. 23 shows a structure of a sixteenth embodiment of the cooling apparatus of the present invention.

FIG. 23 shows the sixteenth embodiment of the present invention, where the small fans 3 are buried into a dummy substrate 14. This embodiment is useful when the IC chips 2 above the small fans 3 have a high heating value. When the temperature of the IC chips 2 below the small fan 3 reaches a higher temperature than the IC chips 2 above the fan in this embodiment, the small fan 3 reversely rotates and cools the lower IC chips 2. In other words, the small fan 3 is controlled so that its rotating direction is normal or reverse, on the basis of the value detected by the temperature sensors which are fitted to the upper and lower IC chips. According to this sixteenth embodiment, the temperature distribution of the upper and lower IC chips is uniform; the cooling performance by the impinging jet stream 4 is improved, and the temperature distribution of the IC chips 2 inside the package casing is uniform.

Figure 24:
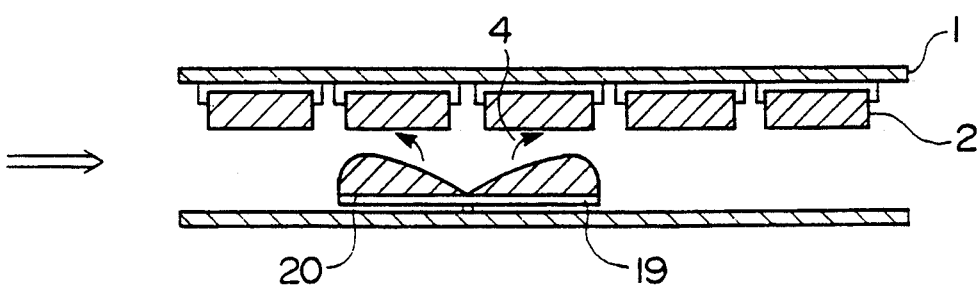
FIG. 24 shows a structure of a seventeenth embodiment of the cooling apparatus of the present invention.

FIG. 24 shows the seventeenth embodiment of the present invention, where the fan using a propeller 20 on a flat sheet type motor 19 is mounted onto the substrate 1. Since the flat sheet type motor 19 is used in this embodiment, the fan for jet stream cooling can be thin. The sensor is fitted into the circuit of the flat sheet type motor 19 so that the temperature of the IC chips 2 can be detected and the number of revolutions of this motor 19 can be controlled in the same way as in the case of the small fan 3. Therefore, the maximum temperature of the group of the IC chips 2 can be lowered; the temperature distribution can be made uniform, and reliability of the IC chips 2 can be secured.

Figure 25:
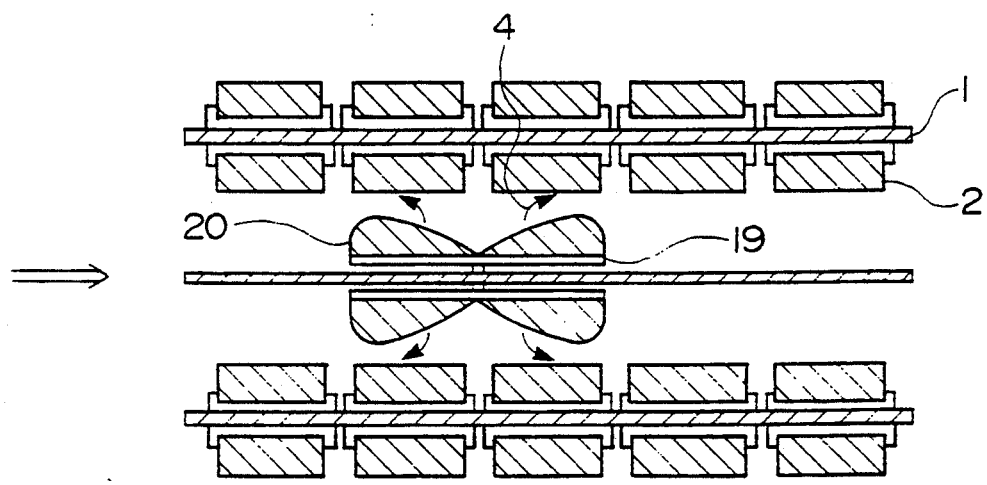
FIG. 25 shows a structure of an eighteenth embodiment of the cooling apparatus of the present invention.

FIG. 25 shows the eighteenth embodiment of the present invention, where the seventeenth embodiment shown in FIG. 24 is applied to both-side packages.

Figure 26:
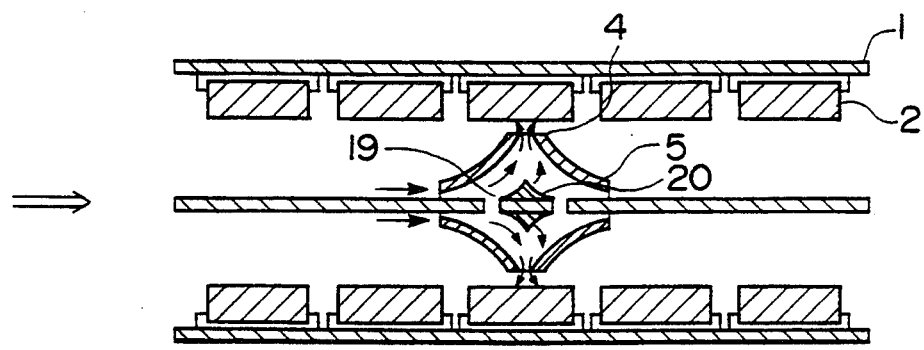
FIG. 26 shows a structure of a nineteenth embodiment of the cooling apparatus of the present invention.

FIG. 26 shows the nineteenth embodiment of the present invention, where the flat sheet type motor 19 is disposed inside a conical slit plate 5, and a mountain-shaped propeller 20 is fitted to the flat sheet type motor 19. In this embodiment, additionally, the number of revolutions of the flat sheet type motor 19 is controlled by the temperature sensor in the same way as in the seventeenth embodiment as shown in FIG. 24. This embodiment directs the flow in the horizontal direction to the upper and lower directions. In other words, the cooling performance is improved by causing the jet stream 4 to impinge against the IC chips 2.

Figure 27:
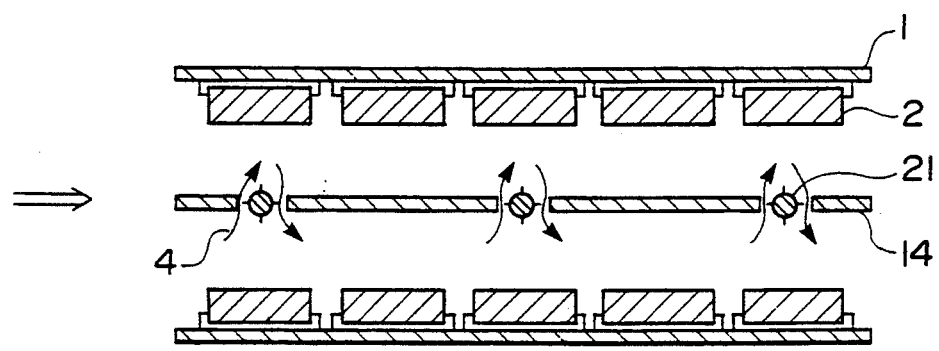
FIG. 27 shows a structure of a twentieth embodiment of the cooling apparatus of the present invention.

FIG. 27 shows the twentieth embodiment of the present invention, where an axial fan 21 is fitted to the dummy substrate 14 and the number of revolutions of this axial fan 21 is controlled on the basis of the value detected by the temperature sensor. Since the axial fan 21 is used, the fan is fitted by securing only the space corresponding to that of the dummy substrate 14. Furthermore, an unnecessary fluid which does not contribute to cooling can be sufficiently mixed and agitated with the fluid the temperature of which has risen due to the heat radiation from the IC chips 2. It is therefore possible to improve the cooling performance, to make the temperature distribution of the group of the IC chips 2 uniform and to obtain reliability.

Figure 28:
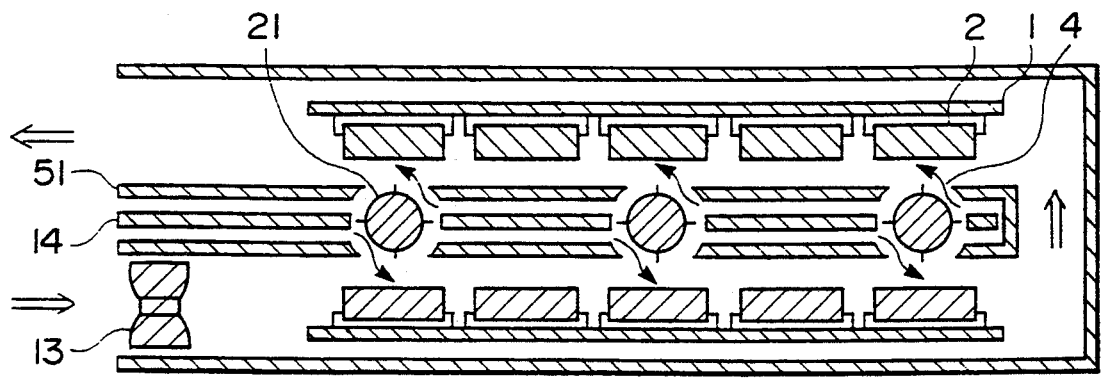
FIG. 28 shows a structure of a twenty-first embodiment of the cooling apparatus of the present invention.

FIG. 28 shows the twenty-first embodiment of the present invention, where the axial fan 21 is fitted to the dummy substrate 14, and the guide plates 51 are further disposed above and below the fan 21. In this twenty-first embodiment, an inlet port fan 13 is fitted so that the exhaust port, and the intake port exist on the same side. According to this structure, too, the cold cooling fluid can be caused to impinge against the group of the IC chips 2.

Figure 29:
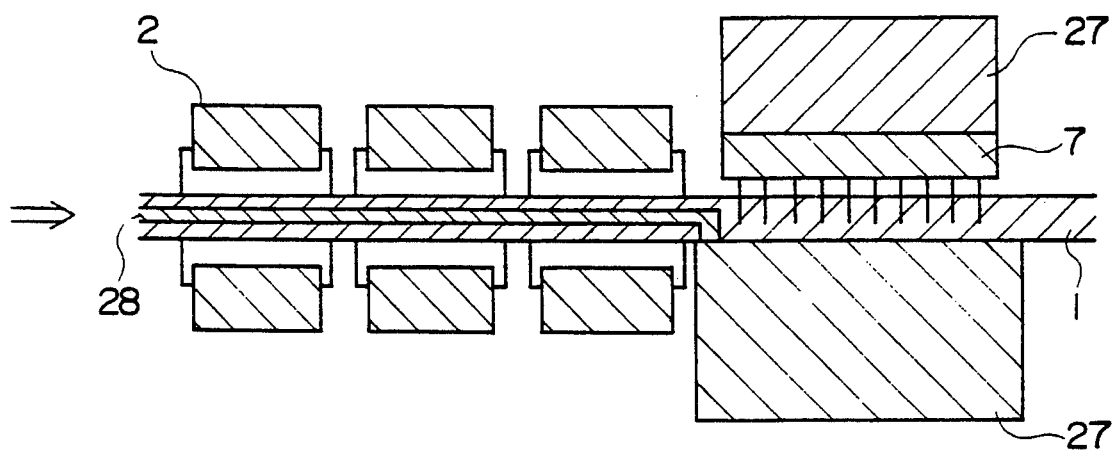
FIG. 29 shows a structure of a twenty-second embodiment of the cooling apparatus of the present invention.

FIG. 29 shows the twenty-second embodiment of the present invention, where the substrate 1 is utilized when the substrates have a multi-layer structure. In this embodiment, a heat conductive member 28 such as a copper sheet, and a heat pipe are disposed in the substrate 1, and the group of the IC chips 2 and the LSI package 7 are mounted onto the substrate 1. The heat generated by the LSI package 7 is emitted to the cooling fluid through the heat radiation fin 27, but the IC chips 2 radiate their heat through the substrate 1. Accordingly, heat radiation from the group of the IC chips 2 is effected through the heat conductive member 28 disposed inside the substrate 1 and is then radiated altogether by the heat radiation fin 27 fitted to the substrate 1. In this embodiment, additionally, the temperature distribution of the group of the IC chips 2 is kept uniform, and the reliability of the IC chips 2 can be obtained.

Figure 30:
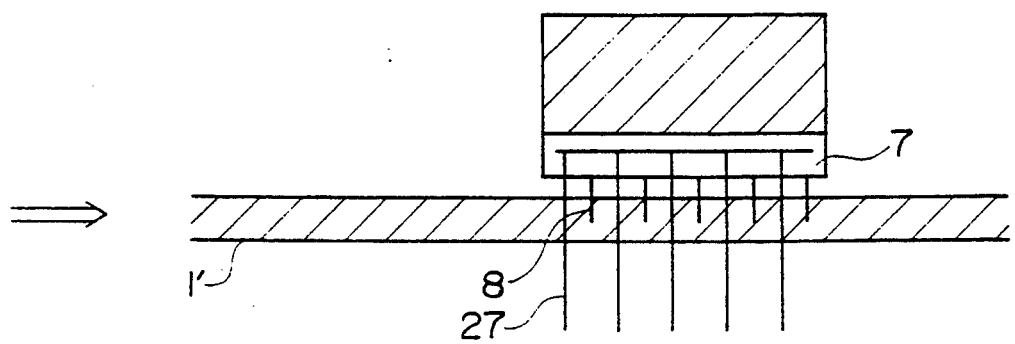
FIG. 30 shows a structure of a twenty-third embodiment of the cooling apparatus of the present invention.

FIG. 30 shows the twenty-third embodiment of the present invention, where those pins among the lead pins 8 of the LSI package 7, which do not contribute to the supply of power, are extended from the back of the substrate 1 and are used as the heat radiation fins 27. In this embodiment, too, the cooling performance of the LSI package 7 is further improved.

Figure 31:
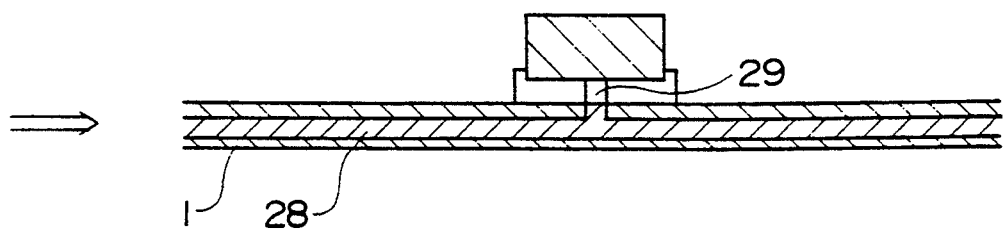
FIG. 31 shows a structure of a twenty-fourth embodiment of the cooling apparatus of the present invention.

FIG. 31 shows the twenty-fourth embodiment of the present invention, where heat radiation of the IC chips 2 is transferred to a heat conductive member 28 formed inside the substrate 1. In this embodiment, a flexible spring 29 having high heat conductivity is fitted to the bottom of each IC chip 2 so that the IC chip 2 transfers the heat to the heat conductive member 28 inside the substrate 1 through this spring 29. The heat thus transferred to the heat conductive member 28 is radiated entirely to the cooling fluid through the heat radiation fin 27 in the same way as in the twenty-third embodiment shown in FIG. 30.

According to the twenty-third and twenty-fourth embodiments, since the substrate has a multi-layered structure, the heat conductive layer 28 is disposed inside or on the surface of the substrate, 1 and the heat radiation of the group of the IC chips 2 can be radiated to the cooling fluid through the heat radiation fin 27.

Figure 32:
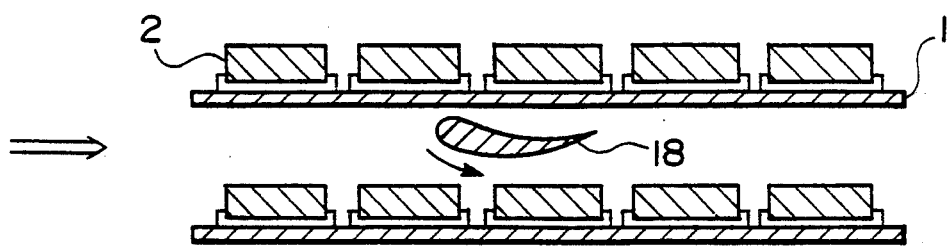
FIG. 32 shows a structure of a twenty-fifth embodiment of the cooling apparatus of the present invention.
Figure 33:
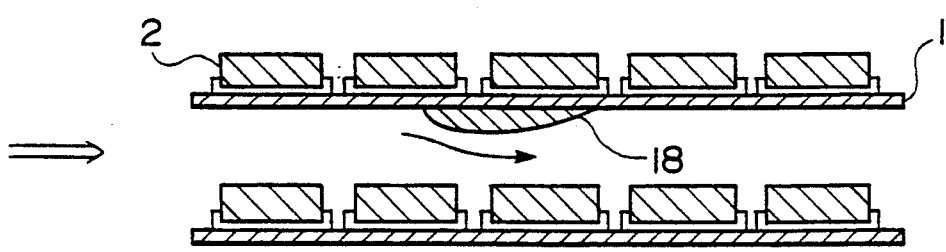
FIG. 33 shows a structure of a twenty-sixth embodiment of the cooling apparatus of the present invention.

FIGS. 32 and 33 show other embodiments of the present invention, which improve parallel flow cooling. As already described, in accordance with the parallel flow cooling system, the temperature of the cooling fluid is higher due to heat radiation from the group of the IC chips 2 on the downstream side. On the other hand, the unnecessary fluid which does not contribute to cooling exists above the substrate 1. In the twenty-fifth embodiment of the present invention shown in FIG. 32, therefore, a wing-shaped slit plate 18 is disposed above the substrate 1 onto which the group of the IC chips 2 are mounted, and the fluid which would be otherwise wasteful contributes to cooling in the fluid travelling direction as represented by arrow. According to this structure, the unnecessary fluid above the substrate 1 is mixed with the fluid whose temperature has risen and can thus improve the cooling performance. Since the slit is wing-shaped, the peel of the flow can be prevented; the pressure loss can be reduced, and the noise can also be reduced.

FIG. 33 shows the twenty-sixth embodiment of the present invention, where the wing-shaped slit plate 18 of the twenty-fifth embodiment shown in FIG. 32 to the upper substrate 1.

Figure 34:
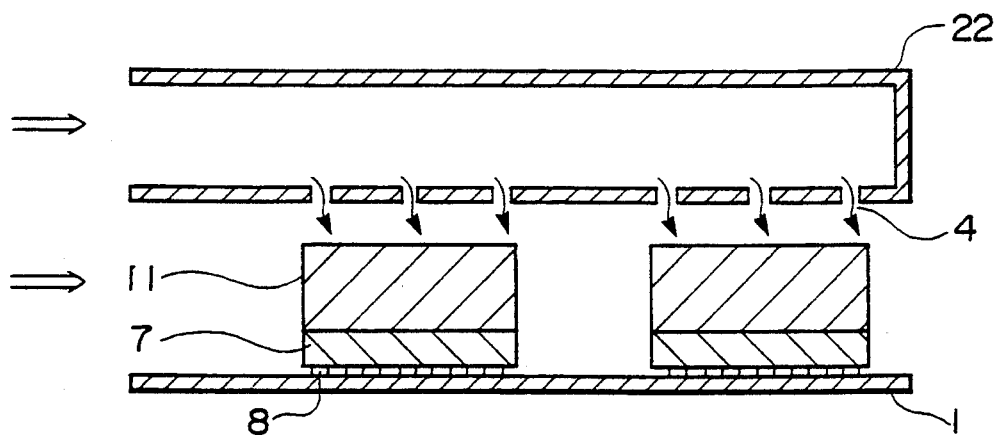
FIG. 34 shows a structure of a twenty-seventh embodiment of the cooling apparatus of the present invention.

FIG. 34 shows the twenty-seventh embodiment of the present invention, where a parallel flat sheet fin 11 is mounted to each LSI package 7, and the jet stream 4 is flown away to the package. The parallel flat sheet fin 11 is advantageous from the aspect of cost, and the cooling performance can be improved by flowing away the jet flow 4 to the parallel flat sheet fin 11 from a chamber 22. In other words, reliability of the LSI package 7 can be obtained.

We claim:

1. In combination, an electronic equipment and a jet stream cooling apparatus for the electronic equipment, said electronic equipment including a plurality of substrates, each of said substrates having a plurality of IC chips and LSI packages mounted thereto; said cooling apparatus including first fan means provided at one end of said substrates for supplying a fresh cooling fluid to said IC chips and LSI packages; a duct provided between said first fan means and said IC ships and LSI packages, said duct having comb-tooth shaped projections, said comb-tooth shaped projections forming flow paths along the substrates; and one or more second fan means provided on a part of said projections and opposite to said IC chips or LSI packages provided on said substrates for cooling said IC chips or said LSI packages, said first fan means and said second fan means cooperating to impinge said fresh cooling fluid as a jet stream on said IC chips or LSI packages for cooling.

2. In combination, an electronic equipment and a jet stream cooling apparatus for the electronic equipment, said electronic equipment including a plurality of substrates, each of the substrates having a plurality of IC chips and LSI packages with cooling fins mounted thereto; said cooling apparatus including first fan means provided at one end of said substrates for supplying a fresh cooling fluid to said IC chips and LSI packages; a duct provided between said first fan means and said IC chips and LSI packages, said duct having comb-tooth shaped projections, said projections forming flow paths along the substrates and having a plurality of small holes for guiding said cooling fluid to said IC chips and to said LSI packages; and one or more second fan means disposed on said LSI packages adjacent said fins and having high heating value, a rotational speed of said second fan means being controlled depending on a temperature of said packages having high heat value, said first and said second fan means cooperating to impinge said fresh cooling fluid as a jet stream on said LSI packages having high heating values.

3. In combination, an electronic equipment and a jet stream cooling apparatus for the electronic equipment, said electronic equipment comprising a plurality of substrates having a plurality of IC chips and LSI packages arranged thereon, and said cooling apparatus including first fan means provided at one end side of said substrates for supplying a fresh cooling fluid to said IC chips and LSI packages, and a duct provided between said first fan means and said IC chips and LSI packages, said duct having comb-tooth shaped projections, the comb-tooth shaped projections forming flow paths along the substrates, said projections having a plurality of small holes supplying the cooling fluid supplied by said first fan means to said IC chips and LSI packages, respectively, another duct forming flow paths continuously adjacent to said duct, said another duct being provided on another end side of said substrates, second fan means being provided on an exit portion of said another duct and, said second fan means effectively discharging the cooling fluid supplied by said first fan means for cooling said IC chips and LSI packages.

* * * * *